United States Patent
Joo et al.

(10) Patent No.: US 9,728,657 B2
(45) Date of Patent: Aug. 8, 2017

(54) PHOTODETECTOR

(71) Applicant: ELECTRONICS AND TELECOMMUNICATIONS RESEARCH INSTITUTE, Daejeon (KR)

(72) Inventors: Jiho Joo, Daejeon (KR); Gyungock Kim, Daejeon (KR); Myungjoon Kwack, Gimpo (KR); Sang Hoon Kim, Daejeon (KR); Sun Ae Kim, Daejeon (KR); In Gyoo Kim, Daejeon (KR); Jaegyu Park, Daejeon (KR); Jin Hyuk Oh, Daejeon (KR); Ki Seok Jang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 41 days.

(21) Appl. No.: 14/812,981

(22) Filed: Jul. 29, 2015

(65) Prior Publication Data

US 2016/0211402 A1    Jul. 21, 2016

(30) Foreign Application Priority Data

Jan. 20, 2015    (KR) .................. 10-2015-0009304

(51) Int. Cl.
*H01L 31/0224*    (2006.01)
*H01L 31/0352*    (2006.01)
(Continued)

(52) U.S. Cl.
CPC ............... *H01L 31/022416* (2013.01); *H01L 31/03529* (2013.01); *H01L 31/1075* (2013.01); *H01L 31/1808* (2013.01); *Y02P 70/521* (2015.11)

(58) Field of Classification Search
CPC .......... H01L 31/109; H01L 31/022416; H01L 31/028; H01L 31/0304; H01L 31/03046; H01L 31/035281
See application file for complete search history.

(56) References Cited

U.S. PATENT DOCUMENTS

| 7,683,397 | B2 | 3/2010 | Sarid et al. |
| 8,482,092 | B2 | 7/2013 | Lee et al. |

(Continued)

FOREIGN PATENT DOCUMENTS

| KR | 10-2008-0028385 A | 3/2008 |
| WO | WO 2007/002953 A2 | 1/2007 |

OTHER PUBLICATIONS

Bowers et al., "High-gain high-sensitivity resonant Ge/Si APD photodetectors", Proc. Of SPIE, 2010, pp. 76603H-1-76603H-8, vol. 7660, Intel Corporation, Santa Clara, CA, USA.

(Continued)

*Primary Examiner* — Fernando L Toledo
*Assistant Examiner* — Neil Prasad

(57) ABSTRACT

Provided is a photodetector including a substrate, a first doped region on the substrate, a second doped region having a ring structure, wherein the second doped region is provided in the substrate, surrounds the first doped region and is horizontally spaced apart from a side of the first doped region, an optical absorption layer on the first doped region, a contact layer on the optical absorption layer, a first electrode on the contact layer, and a second electrode on the second doped region.

20 Claims, 12 Drawing Sheets

(51) Int. Cl.
*H01L 31/107* (2006.01)
*H01L 31/18* (2006.01)

(56) References Cited

U.S. PATENT DOCUMENTS

| | | | |
|---|---|---|---|
| 8,592,247 B2 | 11/2013 | Sim et al. | |
| 2003/0226952 A1* | 12/2003 | Clark | H01L 31/02027 250/214.1 |
| 2006/0289957 A1 | 12/2006 | Morse et al. | |
| 2012/0291158 A1* | 11/2012 | Li | C12N 15/11 800/279 |
| 2013/0292741 A1* | 11/2013 | Huang | H01L 31/1075 257/186 |
| 2015/0108327 A1* | 4/2015 | Huang | H01L 31/02240 250/200 |

OTHER PUBLICATIONS

Duan et al., "310 GHz gain-bandwidth product Ge/Si avalanche photodetector for 1550 nm light detection", Optics Express, May 7, 2012, pp. 11031-11036, vol. 20, No. 10, Institute of Microelectronics, Singapore.

Kang et al., "Epitaxially-grown Ge/Si avalanche photodiodes for 1.3µm light detection", Optics Express, Jun. 23, 2008, pp. 9365-9371, vol. 16, No. 13, Intel Corporation, Santa Clara, CA, USA.

Kang et al., "Monolithic germanium/silicon avalanche photodiodes with 340 GHz gain-bandwidth product", Nature Photonics, Jan. 2009, pp. 59-63, vol. 3, Macmillan Publishers Limited.

\* cited by examiner

PHOTODETECTOR

CROSS-REFERENCE TO RELATED APPLICATIONS

This U.S. non-provisional patent application claims priority under 35 U.S.C. §119 of Korean Patent Application No. 10-2015-0009304, filed on Jan. 20, 2015, the entire contents of which are hereby incorporated by reference.

BACKGROUND

The present disclosure herein relates to a photodetector, and more particularly, to a photodetector using an avalanche effect.

A germanium-on-silicon photodetector is an optical device developed in order to amplify a small optical signal to have high efficiency and is generally fabricated by the epitaxial growth of a deposition layer, a charge layer, a germanium optical absorption layer, and a contact layer on a silicon substrate. Since in such an epitaxial growth process of many layers, it takes a long time and the quality of an epitaxial growth layer affects the performance of a device, a yield decreases in a fabrication process.

SUMMARY

The present disclosure provides a photodetector that has enhanced performance.

Tasks to be performed by the inventive concept are not limited to the above-mentioned tasks and other tasks not mentioned may be clearly understood by a person skilled in the art from the following descriptions.

An embodiment of the inventive concept provides a photodetector including a substrate, a first doped region in an upper portion of the substrate, a second doped region having a ring structure, wherein the second doped region may be provided in the substrate, surround the first doped region and be horizontally spaced apart from a side of the first doped region, an optical absorption layer on the first doped region, a contact layer on the optical absorption layer, a first electrode on the contact layer, and a second electrode on the second doped region.

In an embodiment, the photodetector may further include a third doped region having a ring structure, wherein the third doped region may be provided in the substrate, surround the first doped region and be disposed between the first doped region and the second doped region, and wherein the substrate may be an intrinsic silicon substrate, the first doped region and the third doped region may have a first conductive type and the second doped region may have a second conductive type.

In an embodiment, the photodetector may further include a fourth doped region under the first doped region provided in the substrate, and a third doped region having a ring structure, wherein the third doped region may be provided in the substrate and surround the first doped region and the second doped region, and wherein the first doped region and the third doped region may have a first conductive type, the substrate may be a second conductive type silicon substrate, the second doped region and the fourth doped region may have a second conductive type, and the doping concentration of the fourth doped region may be higher than that of the substrate.

In an embodiment, the first conductive type may be a p type and the second conductive type may be an n type.

In an embodiment, the first doped region may have a plurality of rings when viewed from a top.

In an embodiment, depths of lower surfaces of the plurality of rings may be different from one another.

In an embodiment, the plurality of rings may have different doping concentrations.

In an embodiment, the optical absorption layer may include any one selected from among germanium (Ge), gallium arsenic (GaAs), indium phosphide (InP), and indium gallium arsenic (InGaAs).

In an embodiment, the photodetector may further include an etched guard ring having a ring structure, wherein the etched guard ring may protrude from the substrate and surround the first doped region, and wherein the substrate and the etched guard ring may be intrinsic silicon, the first doped region may have a first conductive type and the second doped region may have a second conductive type.

In an embodiment of the inventive concept, a photodetector may include a substrate, an optical waveguide protruding from the substrate and extended in a first direction, a first doped region in an upper portion of the optical waveguide, second doped regions being spaced apart from the optical waveguide in a second direction intersecting the first direction, an optical absorption layer on the first doped region, and a contact layer on the optical absorption layer, wherein the substrate may include a buried oxide layer.

In an embodiment, the substrate and the waveguides may be intrinsic silicon, the first doped region may have a first conductive type and the second doped regions may have a second conductive type.

In an embodiment, the photodetector may further include a third doped region provided in the substrate and under the first doped region, wherein the first doped region may have a first conductive type, the second dope region and the third doped region may have a second conductive type, and the substrate and the waveguides may be second conductive type silicon.

In an embodiment, the first conductive type may be a p type and the second conductive type may be an n type.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
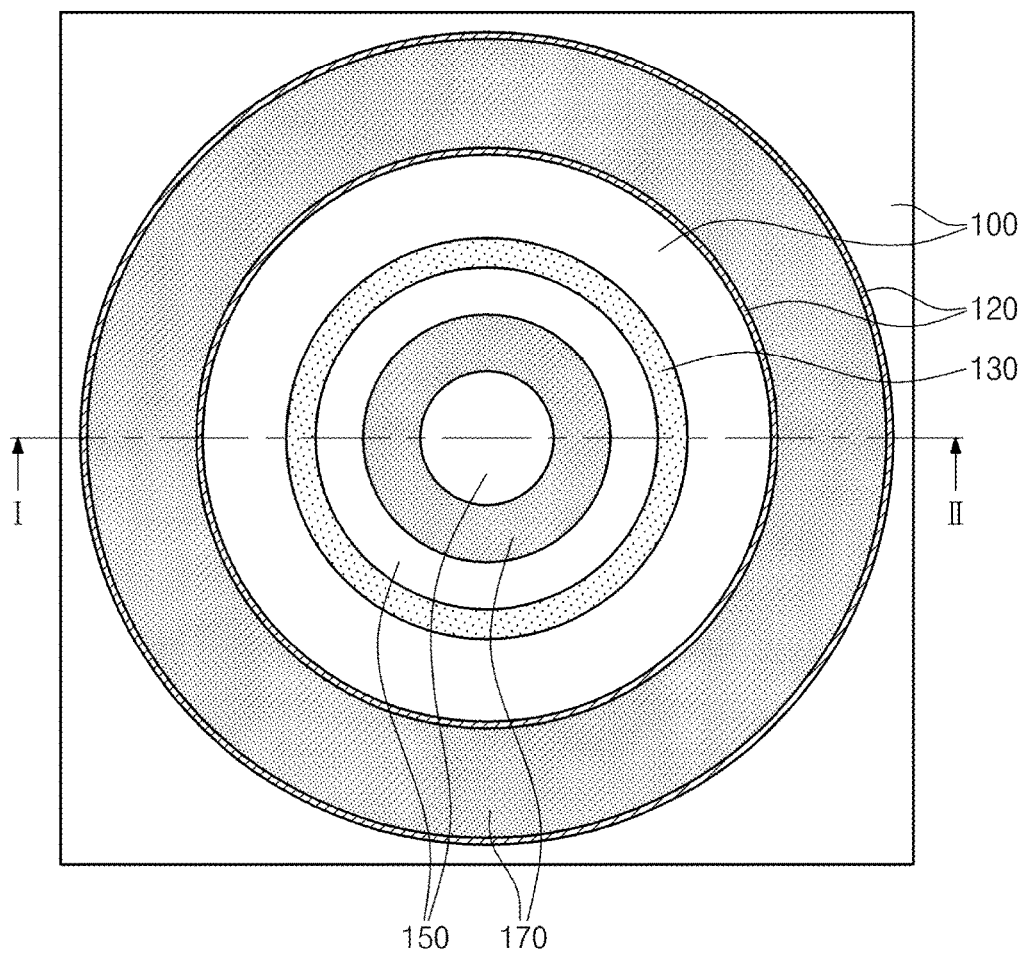
FIG. 1 is a plan view of a photodetector according to embodiments of the inventive concept.

The above objectives, other objectives, characteristics and advantages of the inventive concept will be easily understood through the following exemplary embodiments to be described with reference to the accompanying drawings. However, the inventive concept is not limited embodiments to be described below but may be implemented in other forms. On the contrary, embodiments introduced herein are provided to make disclosed contents thorough and complete and to sufficiently transfer the spirit of the inventive concept to a person skilled in the art.

The term 'and/or' used in the specification is used as a meaning including at least one of components listed before and after the term. Also, the expression 'connected' or 'coupled' to another component may include when a component is connected or coupled directly to the other component or there may be a component in between.

In the specification, when a film (or layer) is referred to as being 'on' another film (or layer) or substrate, it can be directly on the other film (or layer) or substrate, or a third film (or layer) may also be present in between. The terms used herein are only for explaining embodiments, not limiting the inventive concept. The terms of a singular form also includes plural forms unless referred to the contrary. The component, step, operation and/or device that uses the expression 'includes' in the specification does not exclude the presence or addition of one or more other components, steps, operations and/or devices.

Also, though terms such as first, second, and third are used to describe various regions and films (or layers) in various embodiments of the inventive concept, the regions and the films are not limited to these terms. These terms are used only to distinguish a certain region or film (or layer) from another region or film (or layer). Thus, a component referred to as first film (or layer) in an embodiment may also be referred to as a second film (or layer) in another embodiment. Embodiments that are described and illustrated herein also include their complementary embodiments. Parts indicated by the same reference numerals represent the same components throughout the disclosure.

Embodiments of the inventive concept are described with reference to ideal, exemplary cross sectional views and/or plan views of the inventive concept. In the drawings, the size and thickness of components are exaggerated for clarity. Thus, the forms of exemplary views may vary depending on fabrication technologies and/or tolerances. Embodiments of the inventive concept are not limited to shown, specific forms and also include variations in form produced according to fabrication processes. For example, an etch region shown in a rectangular shape may have a round shape or a shape having a certain curvature. Also, an absorption layer and a contact region that are shown in a circular shape may have another shape in order to enhance the performance of a device or increase a yield in a fabrication process. Thus, regions illustrated in the drawings are exemplary, and the shapes of the regions illustrated in the drawings are intended to illustrate the specific shapes of the regions of a device and not to limit the scope of the inventive concept.

Figure 2:
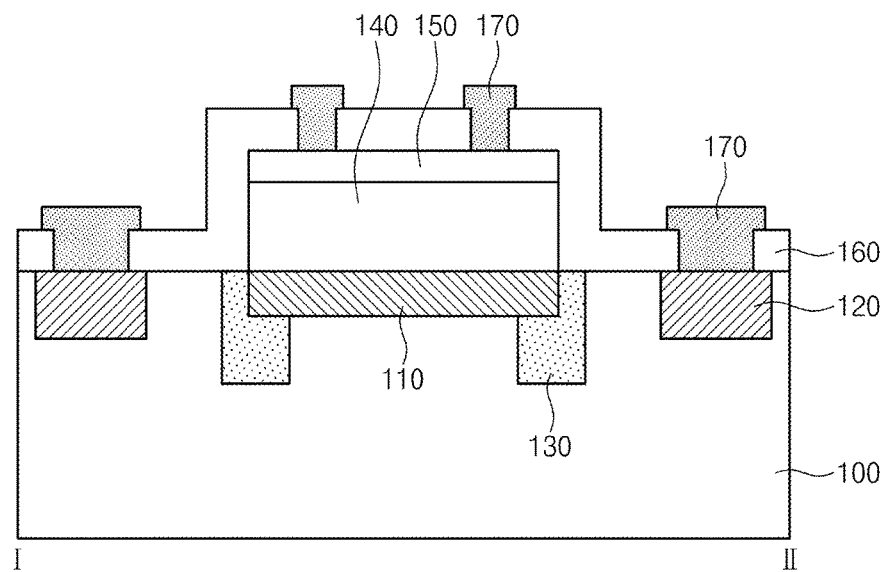
FIG. 2 is a cross-sectional view taken along line I-II in FIG. 1 related to an example of a photodetector according to an embodiment of the inventive concept.

FIG. 1 is a plan view of a photodetector according to embodiments of the inventive concept. In FIG. 1, a protective layer 160 is not shown. FIG. 2 is a cross-sectional view taken along line I-II in FIG. 1 related to an example of a photodetector according to an embodiment of the inventive concept.

Referring to FIGS. 1 and 2, the photodetector according to the embodiment of the inventive concept may include, a first doped region 110 in a substrate 100, a second doped region 120 in the substrate 100, a third doped region 130 in the substrate 100 that is selective, an optical absorption pattern 140, a contact pattern 150, and electrodes 170 on the second doped region 120 and the contact pattern 150. In an example, the protective layer 160 that covers all of the substrate 100, the contact pattern 150, and the optical absorption pattern 140 may be provided.

The substrate 100 may be an intrinsic silicon substrate. The intrinsic silicon substrate 100 may be helpful in improving a signal amplification effect. However, the substrate 100 is not limited to the intrinsic substrate and may be a n type or p type silicon substrate.

The first doped region 110 may be disposed in an upper portion of the substrate 100. The first doped region 110 may be a region doped with a first conductive type. The first conductive type may be a p type or n type. A doping material may be III-group element such as boron (B), aluminum (Al), gallium (Ga), or indium (In) in the case of p type doping. In the case of n type doping, it may be IV-group element such as nitrogen (N), phosphorous (P), arsenic (As), or stibium (Sb). In an example, doping concentration may be about $10^{14}$ cm$^{-3}$ to about $10^{21}$ cm$^{-3}$. In an example, the first doped region 110 may be a charge region. The charge region 110 may provide an electric field. The electric field may accelerate electrons and holes generated by photons. When the magnitude of the electric field is sufficient, an avalanche effect may occur. The charge region 110 may have a structure having a flat lower surface. The depth of the charge region 110 may be about 10 nm to about 500 nm.

An amplification region (not shown) may be disposed under the charge region 110. A signal by photodetection may be amplified in the amplification region (not shown).

The second doped region 120 may be disposed in a ring structure surrounding the first doped region 110. The second doped region 120 may be provided in the substrate 100 and may be horizontally spaced apart from the side of the first doped region 110. The second doped region 120 may have a second conductive type. The second doped region 120 may be referred to as a contact region. The contact region 120 may be a region connected to the electrode 170.

The third doped region 130 may be disposed in a ring structure surrounding the first doped region 110. The third doped region 130 may be disposed between the first doped region 110 and the second doped region 120. In an example, the distance between the second doped region 120 and the third doped region 130 may be about 10 nm to about 1 µm. The third doped region 130 may have the first conductive type. The third doped region 130 may be a guard ring. It is possible to prevent breakdown from easily occurring, due to the guard ring being spaced apart and having the ring structure.

The optical absorption pattern 140 may be disposed on the first doped region 110. The optical absorption pattern 140 may effectively absorb photon. In an example, the thickness of the optical absorption pattern 140 may be about 100 nm to about 5 μm. The diameter or width of the optical absorption pattern 140 may be about 1 μm to about 300 μm. The optical absorption pattern 140 may include germanium (Ge), gallium arsenic (GaAs), indium phosphide (InP), or indium gallium arsenic (InGaAs). The optical absorption pattern 140 may be an epitaxial layer.

The contact pattern 150 may be disposed on the optical absorption pattern 140. The contact pattern 150 may include first conductive type silicon. The contact pattern 150 may be connected to the electrode 170.

The protective layer 160 that covers all of the substrate 100, the optical absorption pattern 140, and the contact pattern 150 may be disposed. A silicon oxide film ($SiO_x$) or silicon nitride film ($SiN_x$) may be included in the protective layer 160. The protective layer 160 may play roles in protecting components under the protective layer 160 from physical and electrical damages and in electrically separating regions.

The electrodes 170 may be disposed so that they pass through the protective layer 160 to be in contact with the contact region 120 and the contact pattern 150, respectively. The electrodes 170 may be conductive materials. The conductive materials may be metal or metallic compound. For example, the conductive material may be aluminum (Al), copper (Cu), titanium (Ti), titanium nitride (TiN), platinum (Pt), tantalum (Ta), or compound thereof.

A typical photodetector may be fabricated by the epitaxial growth of layers. It may take a long time to perform an epitaxial growth process. In addition, the quality of an epitaxial growth layer affects the performance of a device. Thus, a yield may decrease in a fabrication process. According to a photodetector according to embodiments of the inventive concept, it is possible to minimize the epitaxial growth process. Thus, it is possible to obtain a photodetector compatible with a CMOS process.

Figure 3:
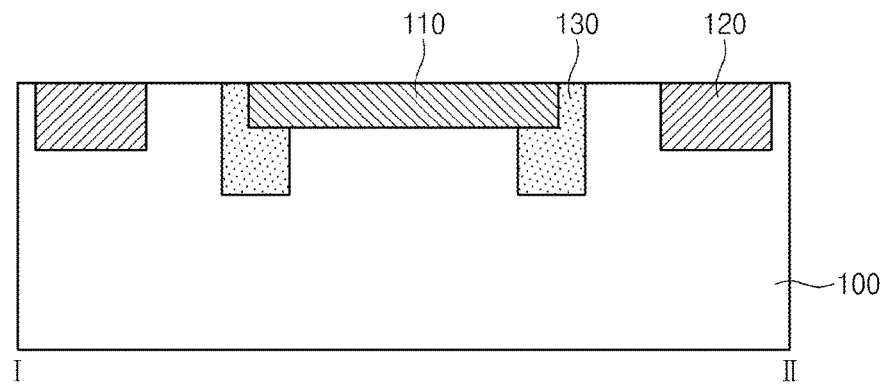
FIGS. 3 and 4 represent an example of a method of fabricating a photodetector according to an embodiment of the inventive concept and are cross-sectional views corresponding to line I-II in FIG. 1.
Figure 4:
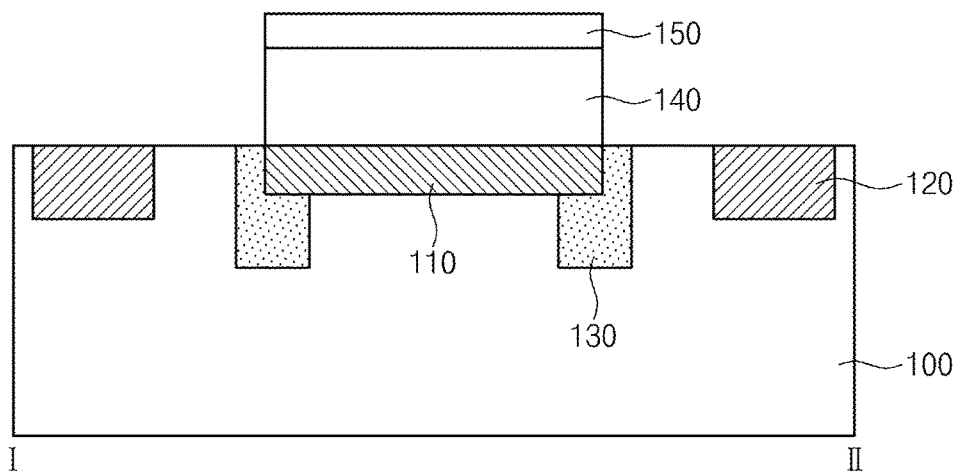

FIGS. 3 and 4 represent an example of a method of fabricating a photodetector according to an embodiment of the inventive concept and are cross-sectional views corresponding to line I-II in FIG. 1.

Referring to FIG. 3, the first doped region 110, the second doped region 120, and the third doped region 130 may be disposed on the substrate 100, in the structure as described above. In an example, the doped regions 110 to 130 may be formed by using an ion implantation process using a photoresistor (not shown) as a mask. After the ion implantation process, the photoresistor (not shown) may be removed.

Referring to FIG. 4, the optical absorption pattern 140 and the contact pattern 150 may be formed on the substrate 100. The optical absorption pattern 140 and the contact pattern 150 may be formed by using a chemical vapor deposition (CVD) process. The CVD process may include reduced-pressure chemical vapor deposition (RPCVD) and ultra high vacuum chemical vapor deposition (UHCVD) processes.

The optical absorption layer (not shown) may be obtained through epitaxial growth. As an example, the optical absorption layer (not shown) may be formed by using germanium epitaxial growth. For example, germanium hydride ($GeH_4$) gas may be provided to the substrate 100. A pressure of about 1 Torr to about 300 Torr and a temperature of about 300° C. to about 500° C. may be provided to the substrate 100. The germanium hydride ($GeH_4$) gas may be decomposed into germanium (Ge) and hydrogen ($H_2$) gases and the germanium obtained through the decomposition may grow on the substrate 100 in an amorphous state. The temperature of the substrate 100 may increase to about 600° C. to about 700° C. An amorphous germanium layer may be crystallized. Thus, a germanium epitaxial layer (not shown) may be formed on the crystallized germanium layer.

In an example, the contact layer (not shown) may be disposed on the optical absorption layer (not shown). The contact layer (not shown) may be formed by doped silicon epitaxial or poly silicon growth. In an example, a silicon epitaxial or poly silicon layer may be formed on the optical absorption layer (not shown) by the simultaneous thermal decomposition of $SiH_4$ gas and a gas including a doping material (e.g., $BH_3$ gas in the case of a p type and $PH_3$ gas in the case of a n type). The doping concentration of the contact layer (not shown) may be about $10^{14}$ cm$^{-3}$ to about $10^{21}$ cm$^{-3}$ but the inventive concept is not limited thereto.

In an example, the optical absorption pattern 140 may be formed by the patterning of the optical absorption layer (not shown). The pattering process may include dry etching or wet etching. Only the optical absorption layer (not shown) may be selectively etched. For example, the dry etching may be used so that the etching speed of the germanium and the silicon are different from each other. In the wet etching, an etching material etching only the germanium may be used. In another example, the optical absorption pattern 140 may be formed by selective epitaxial growth (SEG). The optical absorption pattern 140 may be formed at a desired location without patterning.

The contact pattern 150 may be formed by the patterning of the contact layer (not shown). In another example, the contact pattern 150 may be formed by the SEG. The contact pattern 150 may be formed at a desired location without patterning.

Referring back to FIG. 2, the protective layer 160 may be disposed to cover all of the substrate 100, the contact pattern 150, and the optical absorption pattern 140. The protective layer 160 may be formed by a CVD process. The protective layer 160 may be etched so that the upper portions of the contact region 120 and the contact pattern 150 may be exposed.

The electrodes 170 may be disposed on the contact region 120 and the contact pattern 150 that have been exposed. The electrodes 170 may include silicide films (not shown). Contact resistances between the electrodes 170 and the contact region 120 and between the electrode 170 and the contact pattern 150 may decrease.

FIGS. 5 to 12 represent other examples of a photodetector according to an embodiment of the inventive concept and are cross-sectional views corresponding to line I-II in FIG. 1.

Figure 5:
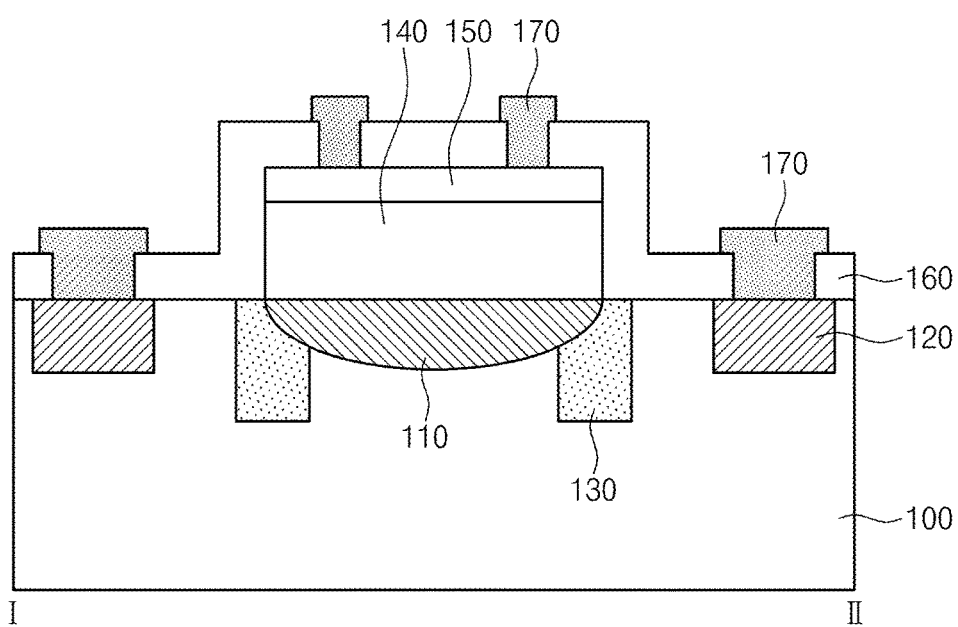
FIGS. 5 to 12 represent other examples of a photodetector according to an embodiment of the inventive concept and are cross-sectional views corresponding to line I-II in FIG. 1.
Figure 6:
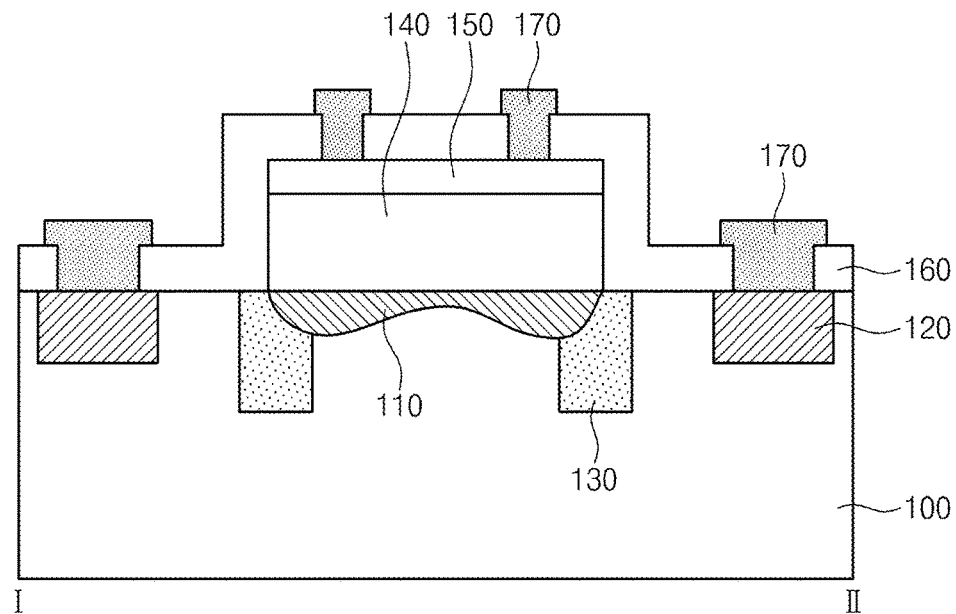
Figure 7:
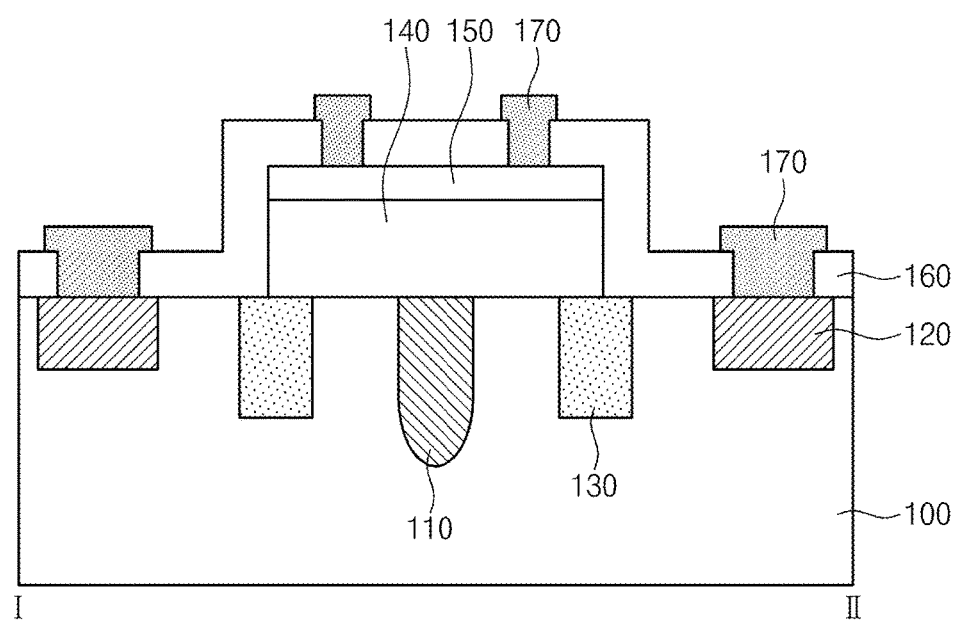
Figure 8:
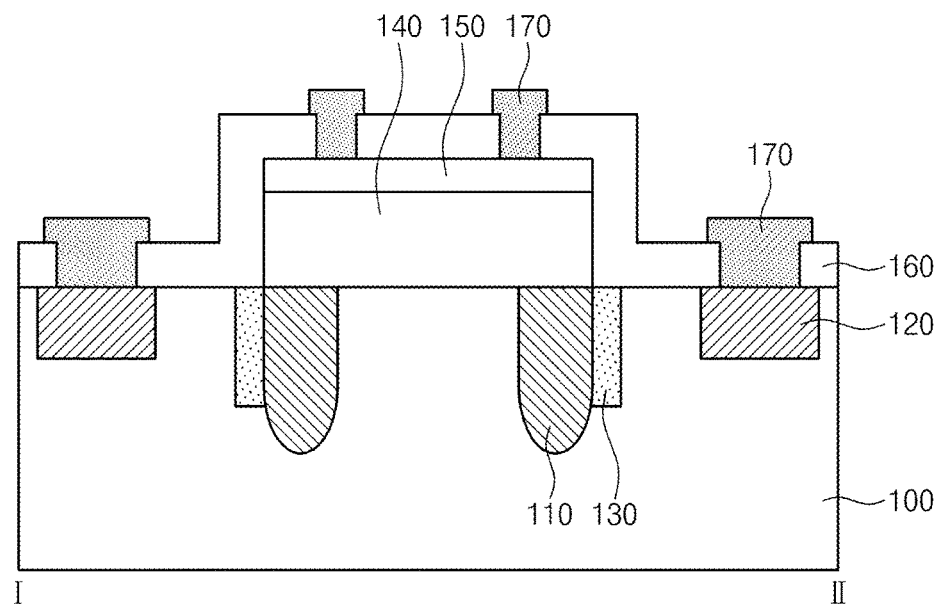
Figure 9:
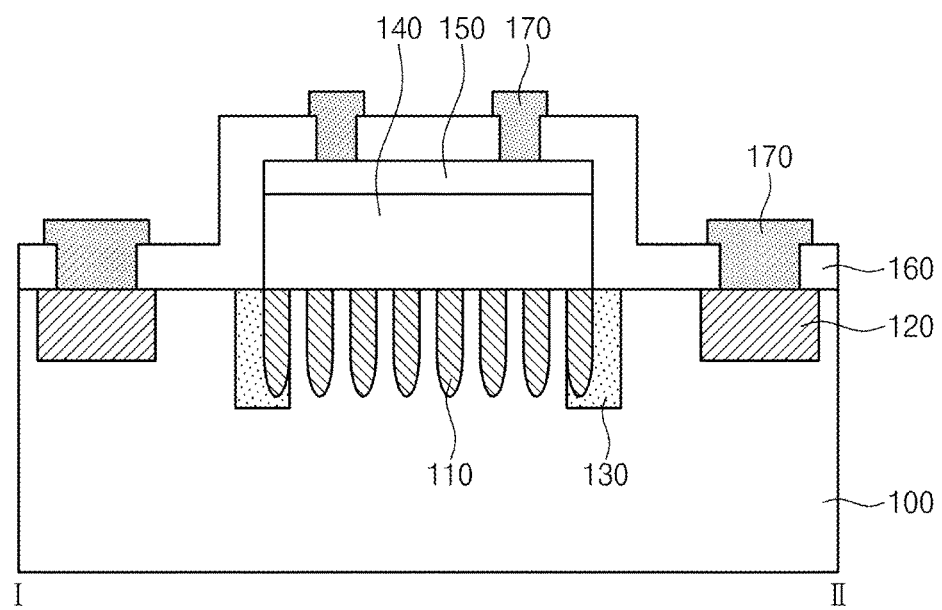

Referring to FIGS. 1 and 5, the lower surface of the charge region 110 may have a convex structure. Referring to FIGS. 1 and 6, the lower surface of the charge region 110 may have a concave structure. Referring to FIGS. 1 and 7, the lower surface of the charge region 110 may have a cylindrical structure. Referring to FIGS. 1 and 8, the lower surface of the charge region 110 may have a ring structure. Referring to FIGS. 1 and 9, the lower surface of the charge region 110 may have a structure having a plurality of rings.

Figure 10:
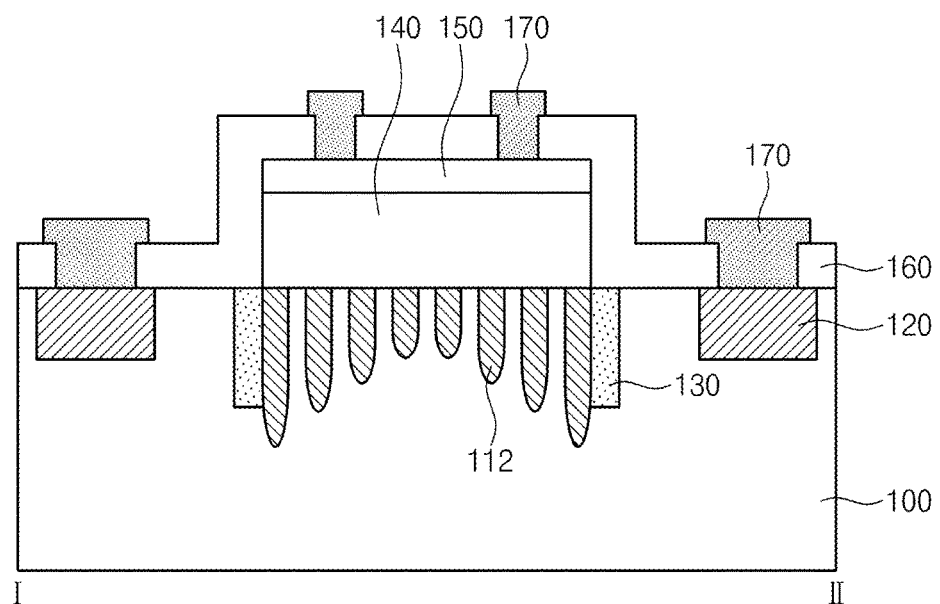
Figure 11:
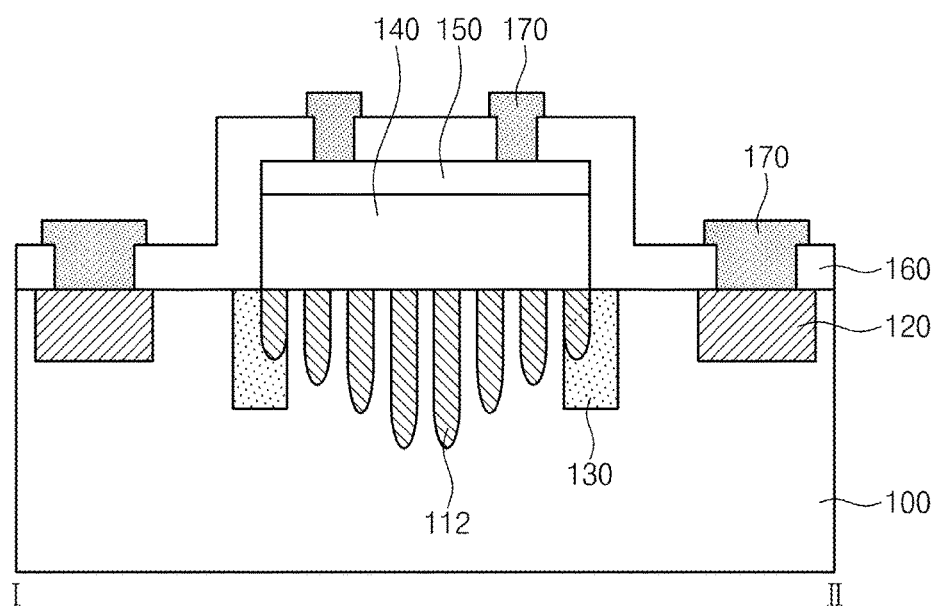
Figure 12:
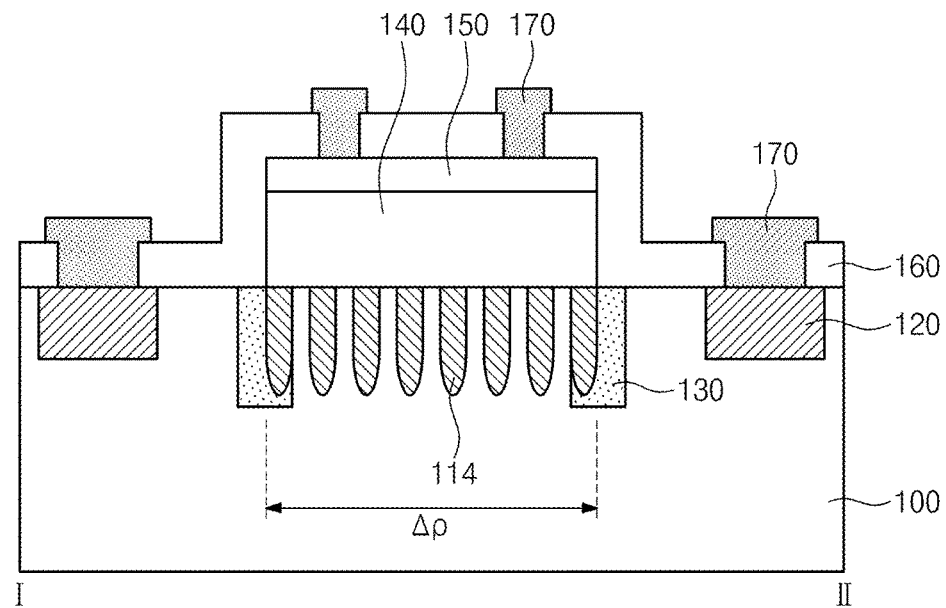

Referring to FIGS. 1, 10 and 11, the rings of the charge region 112 having the structure having the plurality of rings may have different depths. For example, the depth of external rings may be larger than that of internal rings. In another example, the depth of internal rings may be larger than that of external rings. Referring to FIGS. 1 and 12, the rings of the charge region 114 having the structure having the plurality of rings may have different doping concentrations. For example, the doping concentration of external rings may be higher than that of internal rings. In another example, the doping concentration of internal rings may be higher than that of external rings. A variation in the structure or concentration of the charge region 110 may affect the magnitude of the electric field of the charge region 110. Thus, a desired electric field may be obtained.

Figure 13:
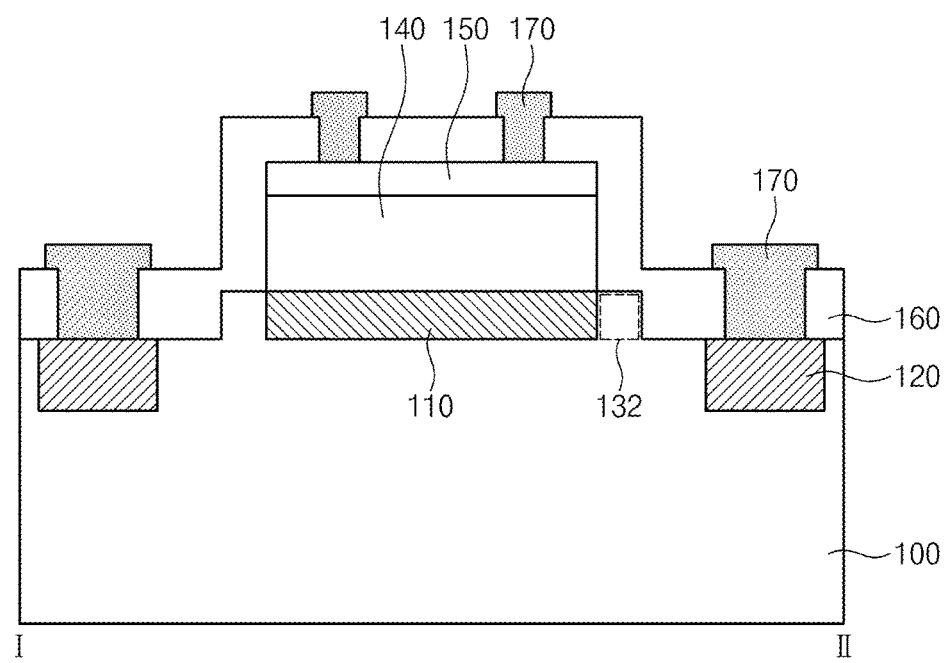
FIG. 13 represents another example of a photodetector according to an embodiment of the inventive concept and is a cross-sectional view corresponding to line I-II in FIG. 1.

FIG. 13 represents another example of a photodetector according to an embodiment of the inventive concept and is a cross-sectional view corresponding to line I-II in FIG. 1;

Referring to FIGS. 1 and 13, an etched guard ring 132 may be disposed on the substrate 100. The etched guard ring 132 may be in contact with the side of the first doped region 110 and have a ring structure. The etched guard ring 132 may have an upper surface higher than the substrate 100. The upper surface of the etched guard ring 132 may have the same height as that of the charge region 110. The etched guard ring 132 may be intrinsic silicon. However, the etched guard ring 132 is not limited to the intrinsic silicon and may be n type or p type silicon. The etched guard ring 132 may enable the electric field in the photodetector to be formed in a desired direction. Thus, it is possible to obtain a photodetector having improved detection performance.

Figure 14:
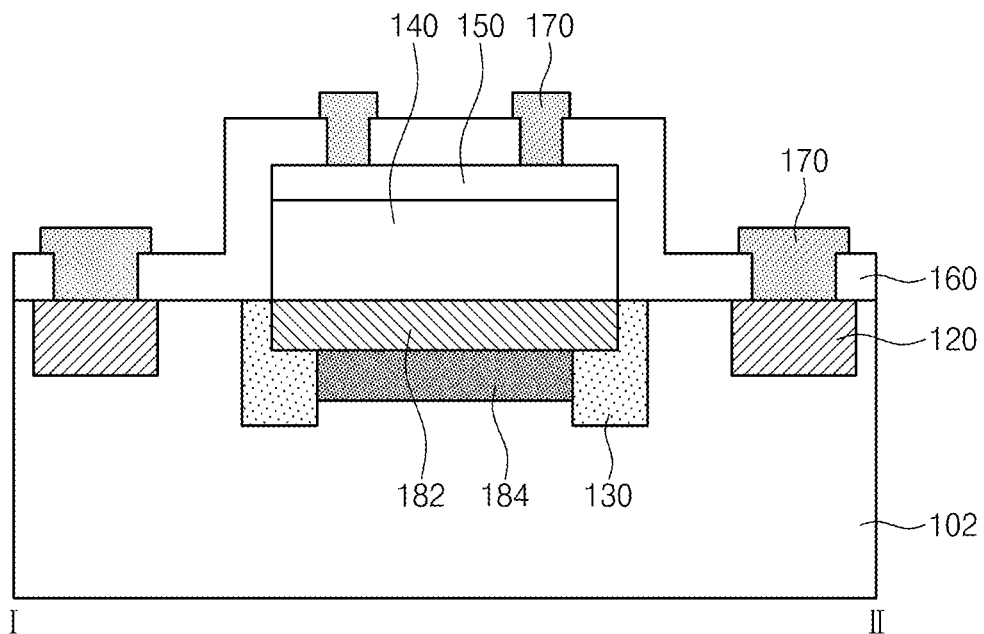
FIG. 14 represents an example of a photodetector according to another embodiment of the inventive concept and is a cross-sectional view corresponding to line I-II in FIG. 1.

FIG. 14 represents an example of a photodetector according to another embodiment of the inventive concept and is a cross-sectional view corresponding to line I-II in FIG. 1.

Referring to FIGS. 1 and 14, the photodetector according to the embodiment of the inventive concept may include, a first doped region 182 in a substrate 102, a second doped region 120 in the substrate 102, a third doped region 130 in the substrate 102 that is selective, a fourth doped region 184, a optical absorption pattern 140, a contact pattern 150, and a electrodes 170 on the second doped region 120 and the contact pattern 150. In an example, a protective layer 160 that covers all of the substrate 102, the contact pattern 150, and the optical absorption pattern 140 may be provided.

The substrate 102 may be a second conductive type silicon substrate. The second conductive type may be a n type or p type. However, the substrate 102 is not limited to the second conductive type and may be an intrinsic silicon substrate.

The first doped region 182 may be disposed in an upper portion the substrate 102. The first doped region 182 may have a first conductive type opposite to the second conductive type. In an example, the doping concentration of the first doped region 182 may be about $10^{14}$ cm$^{-3}$ to about $10^{21}$ cm$^{-3}$ but the inventive concept is not limited thereto. The first doped region 182 may have a structure having a flat lower surface. The depth of the first doped region 182 may be about 10 nm to about 500 nm but the inventive concept is not limited thereto.

The fourth doped region 184 may be formed which is provided in the substrate 102 and disposed under the first doped region 182. The fourth doped region 184 may be disposed at the internal side of the third doped region 130 having a ring structure. The upper surface of the fourth doped region 184 may be in contact with the lower surface of the first doped region. The side of the fourth doped region 184 may be in contact with the internal side of the third doped region 130.

The fourth doped region 184 may have a structure having a flat lower surface. The fourth doped region 184 may be a region doped with a second conductive type. The fourth doped region 184 may be doped with the second conductive type more than the substrate 102. Thus, an avalanche effect may effectively occur at the interface between the fourth doped region 184 and the first doped region 182. In an example, the doping concentration of the fourth doped region 184 may be about $10^{14}$ cm$^{-3}$ to about $10^{21}$ cm$^{-3}$ but the inventive concept is not limited thereto. The second doped region 120 may be disposed which surrounds the first doped region 182 and the fourth doped region 184 and has a ring structure. The second doped region 120 may be provided in the substrate 102 and may be horizontally spaced apart from the side of the first doped region 182. The second doped region 120 may be a region doped with the second conductive type. The second doped region 120 may be a contact region. The contact region 120 may be connected to the electrode 170.

The third doped region 130 may be disposed which surrounds the first doped region 182 and the fourth doped region 184 and has a ring structure. The third doped region 130 may be disposed between the first doped region 182 and the second doped region 120 and between the fourth doped regions 184 and the second doped region 120. In an example, the distance between the second doped region 120 and the third doped region 130 may be about 10 nm to about 1 μm. The third doped region 130 may be a first conductive type guard ring. The guard ring may prevent breakdown from easily occurring.

The optical absorption pattern 140 may be disposed on the first doped region 182. In an example, the thickness of the optical absorption pattern 140 may be about 100 nm to about 5 μm but the inventive concept is not limited thereto. The optical absorption pattern 140 may include germanium (Ge), gallium arsenic (GaAs), indium phosphide (InP), or indium gallium arsenic (InGaAs). The optical absorption pattern 140 may be an epitaxial layer. A contact layer (not shown) may be disposed on the optical absorption layer (not shown). The contact layer (not shown) may be formed by doped silicon epitaxial or poly silicon growth. The silicon epitaxial or poly silicon layer may be formed on the optical absorption layer (not shown) by the simultaneous thermal decomposition of SiH$_4$ gas and a gas including a doping material (e.g., BH$_3$ gas in the case of a p type and PH$_3$ gas in the case of a n type). Although the doping concentration of the contact layer (not shown) may be about $10^{14}$ cm$^{-3}$ to about $10^{21}$ cm$^{-3}$ but the inventive concept is not limited thereto.

The contact pattern 150 may be disposed on the optical absorption pattern 140. The contact pattern 150 may be connected to the electrode 170. The contact pattern 150 may be an epitaxial layer. The contact pattern 150 may include first conductive type silicon.

The protective layer 160 that covers all of the substrate 102, the optical absorption pattern 140, and the contact pattern 150 may be disposed. A silicon nitride film (SiN$_x$) may be included in the protective layer 160.

The electrodes 170 may be disposed so that they pass through the protective layer 160 to be in contact with the contact region 120 and the contact pattern 150. The electrodes 170 may be conductive materials. The conductive materials may be metal or metallic compound. For example, the conductive materials may include any one selected from aluminum (Al), copper (Cu), titanium (Ti), titanium nitride (TiN), platinum (Pt), tantalum (Ta), and compound thereof.

Thus, it is possible to obtain a photodetector compatible with a CMOS process and having enhanced photodetection performance.

Figure 15:
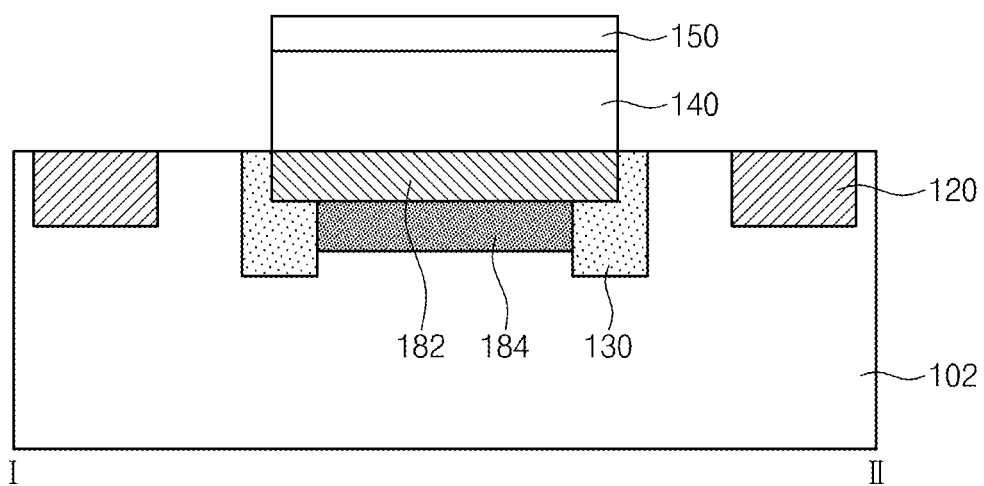
FIGS. 15 and 16 represent an example of a method of fabricating a photodetector according to another embodiment of the inventive concept and are cross-sectional views corresponding to line I-II in FIG. 1.
Figure 16:
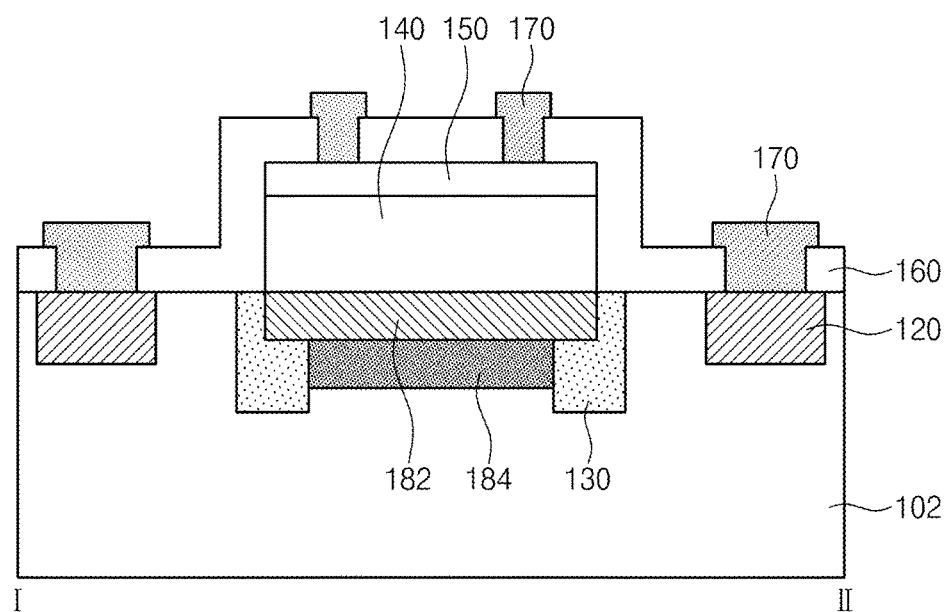

FIGS. 15 and 16 represent an example of a method of fabricating a photodetector according to another embodiment of the inventive concept and are cross-sectional views corresponding to line I-II in FIG. 1. A method of forming the second doped region 120, the third doped region 130, the optical absorption pattern 140, the contact pattern 150, the protective layer 160, and the electrodes 170 from among the components of a photodetector may be the same as that as described above. In the following, other components are described.

Referring to FIGS. 1, 15, and 16, a second conductive type substrate may be provided. The first doped region 182 and the fourth doped region 184 may be disposed on the substrate 102 in which the third doped region 130 has been disposed. The fourth doped region 184 may have a first depth. The first doped region 182 may have a second depth smaller than the first depth. The first and fourth doped regions 182 and 184 may be formed by ion implantation.

Referring back to FIGS. 1 and 14, the protective layer 160 and the electrodes 170 may be disposed.

Figure 17:
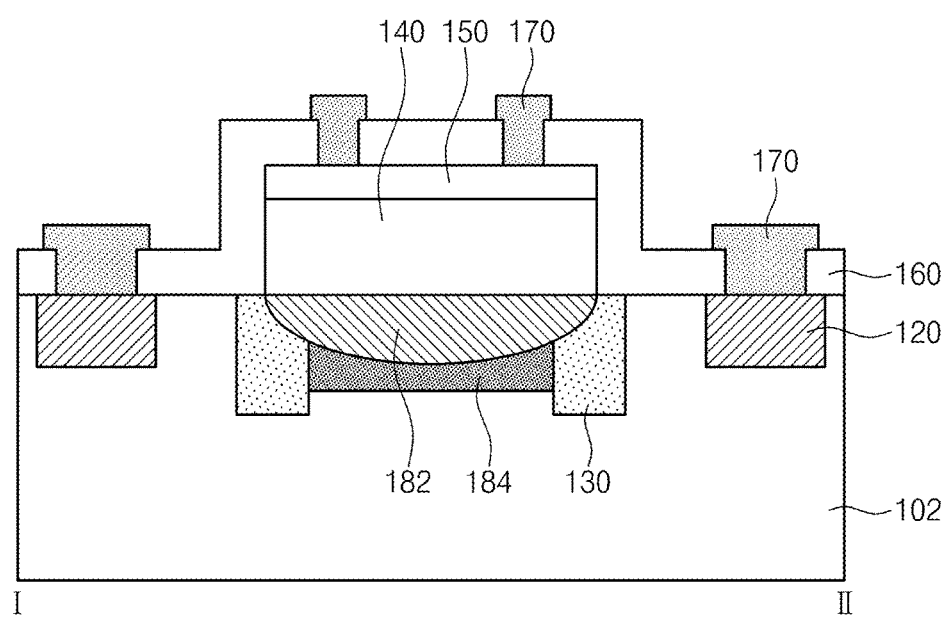
FIGS. 17 to 19 represent other examples of a photodetector according to another embodiment of the inventive concept and are cross-sectional views corresponding to line I-II in FIG. 1.
Figure 18:
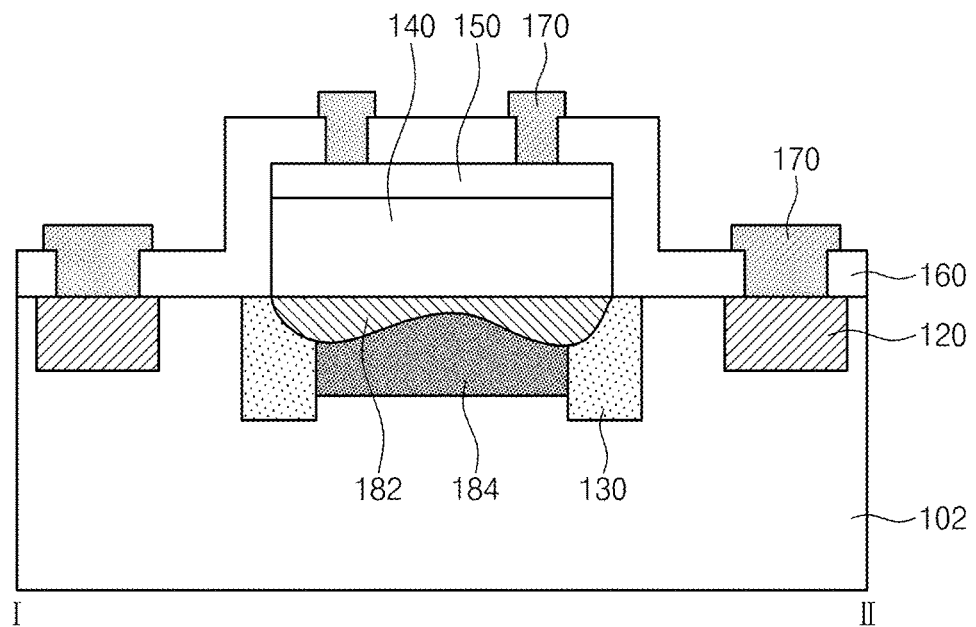
Figure 19:
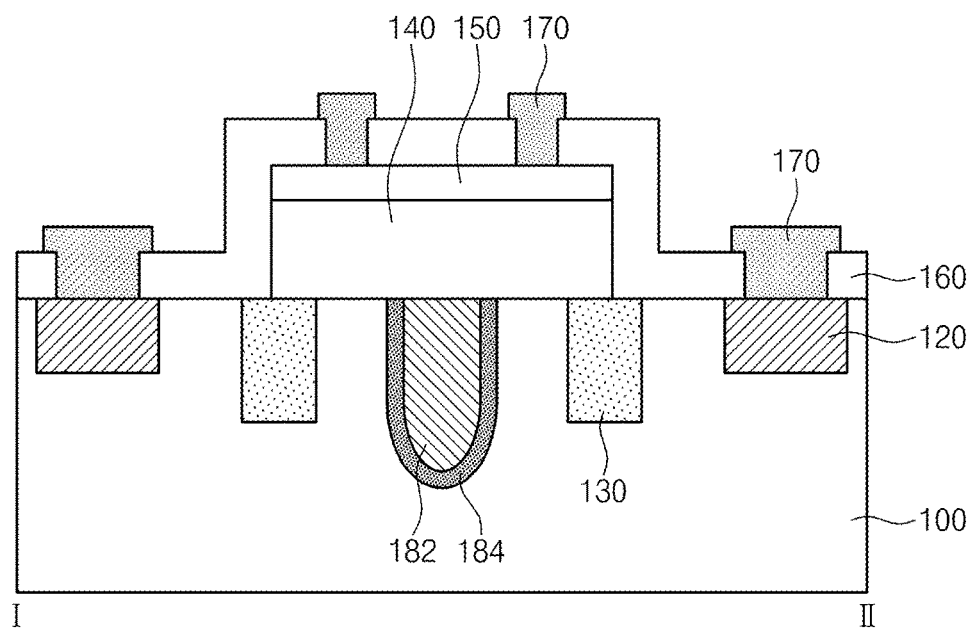

FIGS. 17 to 19 represent other examples of a photodetector according to another embodiment of the inventive concept and are cross-sectional views corresponding to line I-II in FIG. 1.

Referring to FIGS. 1 and 17, the lower surface of the first doped region 182 may have a convex structure. The upper surface of the fourth doped region 184 may have a structure in which it is in contact with the lower surface of the first doped region 182. Referring to FIGS. 1 and 18, the lower surface of the first doped region 182 may have a concave structure. The upper surface of the fourth doped region 184 may have a structure in which it is in contact with the lower surface of the first doped region 182. Referring to FIGS. 1 and 19, the lower surface of the first doped region 182 may have a ring structure. The first doped region 182 may be horizontally spaced apart from the internal side of the third doped region 130. The fourth doped region 184 may have a hollow cylindrical shape surrounding the first doped region. The internal surface of the fourth doped region 184 may have a structure in which it is in contact with the lower surface of the first doped region 182. The upper surface of the fourth doped region 184 may have the same height as that of the substrate 102. The fourth doped region 184 may be horizontally spaced apart from the internal side of the third doped region 130. Additionally, the concentrations (not shown) of the first and fourth doped regions 182 and 184 may vary depending on the location in the first and fourth doped regions 182 and 184. A variation in the structure or concentration of the first and fourth doped regions 182 and 184 may affect an electric field in the photodetector. Thus, it is possible to obtain a desired electric field by adjusting the structure or concentration of the first and fourth doped regions 182 and 184.

Figure 20:
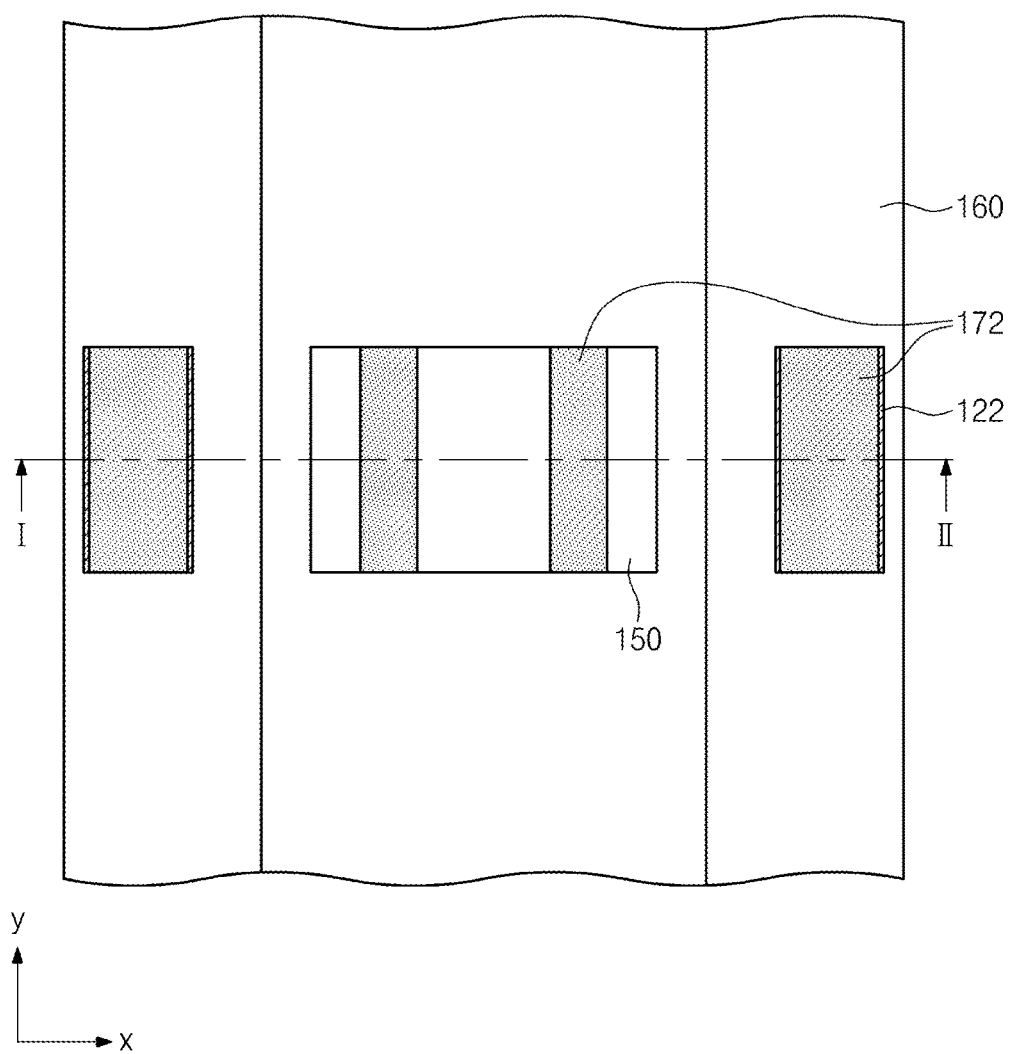
FIG. 20 is a plan view of an example of a photodetector according to another embodiment of the inventive concept.
Figure 21:
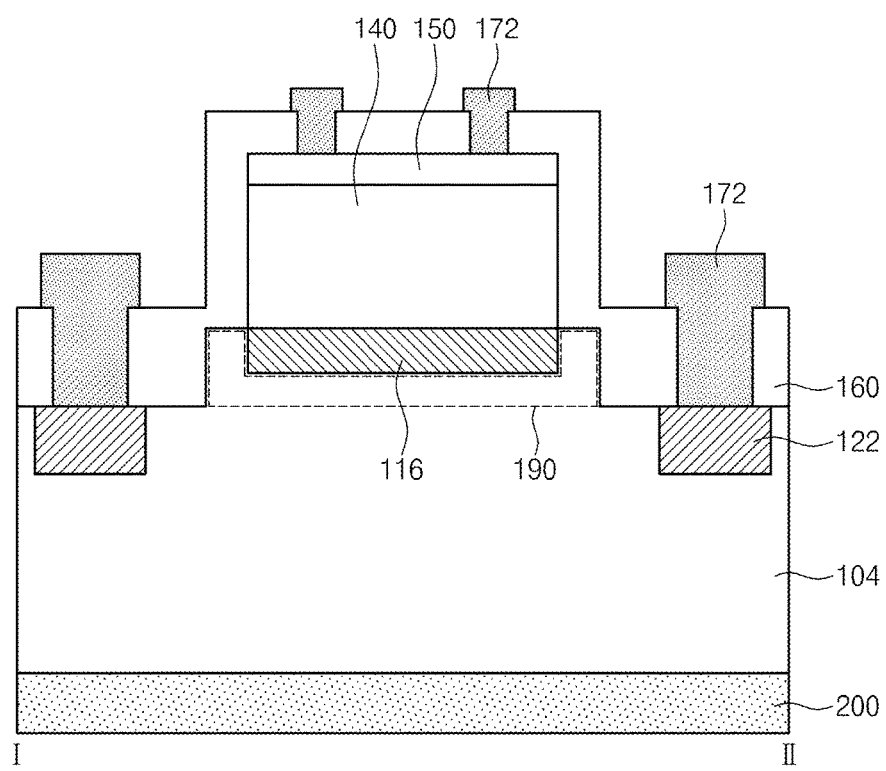
FIG. 21 is a cross-sectional view taken along line I-II in FIG. 20 that represents a method of fabricating a photodetector according to another embodiment of the inventive concept.

FIG. 20 is a plan view of an example of a photodetector according to another embodiment of the inventive concept. The protective layer 160 for description has not been shown. FIG. 21 is a cross-sectional view taken along line I-II in FIG. 20 that represents a method of fabricating a photodetector according to another embodiment of the inventive concept.

Referring to FIGS. 20 and 21, a substrate 104 is provided. A buried oxide layer 200 may be disposed under the substrate 104. A first doped region 116, a second doped region 122, and a third doped region (not shown) that is selective may be disposed in a substrate 104. The optical absorption layer 140, the contact layer 150, and the protective layer 160 and electrodes 172 may be disposed on the first doped region 116.

The substrate 104 may be extended in a first direction (e.g., y direction). The substrate 104 may be an intrinsic silicon layer. However, the substrate 104 is not limited to the intrinsic silicon and may be n type or p type silicon.

A buried oxide layer 200 may be disposed under substrate. The buried oxide layer 200 may be extended in the first direction.

A optical waveguide 190 may protrude from the substrate. The optical waveguide 190 may be extended in the first direction. The upper surface of the optical waveguide 190 may be higher than that of the substrate 104. The optical waveguide 190 may be intrinsic silicon. However, the optical waveguide 190 is not limited to the intrinsic silicon and may be n type or p type silicon. The optical waveguide 190 may move photon from a region being spaced apart from the photodetector to the photodetector.

The first doped region 116 may be disposed in an upper portion of the optical waveguide 190. The first doped region 116 may be formed in the optical waveguide 190. The upper surface of the first doped region 116 may have the same level as that of the optical waveguide 190. The sides of the first doped region 116 may be spaced apart from the sides of the optical waveguide 190. The first doped region 116 may have a hexahedral structure but the inventive concept is not limited thereto. The length of the first direction of the first doped region 116 may be longer than that of the second direction (e.g., x direction) thereof. The first direction and the second direction may be orthogonal to each other. The first doped region 116 may have a depth of about 10 nm to about 500 nm. The first doped region 116 may be a region doped with a first conductive type. For example, a doping concentration may be about $10^{14}$ $cm^{-3}$ to about $10^{21}$ $cm^{-3}$. The first conductive type may be a p type or n type. In an example, the first doped region 116 may be a charge region. Portions of the optical waveguide 190 and/or substrate 104 adjacent to the lower surface of the charge region 116 may be a region in which a signal by detected photon is amplified.

The second doped region 122 may be disposed in an upper portion of the substrate 104. The second doped regions 122 may be spaced apart from the optical waveguide 190 in the second direction (e.g., x direction). The upper surface of the second doped region 122 may have the same level as that of the substrate 104. The second doped regions 122 may have a hexahedral structure but the inventive concept is not limited thereto. The length of the first direction of the second doped regions 122 may be longer than that of the second direction thereof. The second doped regions 122 may be regions doped with a second conductive type opposite to the first conductivity type. The second doped regions 122 may be contacts. The contacts 122 may be connected to the electrodes 172, respectively.

The optical absorption pattern 140 may be disposed on the first doped region 116. The optical absorption pattern 140 may have a hexahedral structure but the inventive concept is not limited thereto. The length of the first direction of the optical absorption pattern 140 may be longer than that of the second direction thereof. In an example, the optical absorption pattern 140 may have a thickness of about 100 nm to about 5 The optical absorption pattern 140 may include germanium (Ge), gallium arsenic (GaAs), indium phosphide (InP), or indium gallium arsenic (InGaAs). The optical absorption pattern 140 may be an epitaxial layer.

The contact pattern 150 may be disposed on the optical absorption pattern 140. The contact pattern 150 may include first conductive type silicon. The contact pattern 150 may be connected to the electrode 172.

The protective layer 160 that covers all of the substrate 104, the optical absorption pattern 140, and the contact pattern 150 may be disposed. The protective layer 160 may be extended in the first direction. The protective layer 160 may include a silicon nitride film ($SiN_x$).

The electrodes 172 may be disposed so that they pass through the protective layer 160 to be in contact with the contact regions 122 and the contact pattern 150. Although it is shown that there are two electrodes 172 on the contact pattern 150, the inventive concept is not limited thereto. For example, one electrode 172 may be disposed on the contact pattern 150. The electrodes 172 may be conductive materials. The conductive material may be metals or metallic compounds. For example, the conductive material may be aluminum (Al), copper (Cu), titanium (Ti), titanium nitride (TiN), platinum (Pt), tantalum (Ta), or compounds thereof.

In an example, a third doped region (not shown) may be provided under the first doped region 116. The third doped region (not shown) may be hexahedral but the inventive concept is not limited thereto. The sides of the third doped region (not shown) may be aligned to the sides of the first doped region 116. The third doped region (not shown) may have a second conductive type opposite to the first conductive type. The third doped region (not shown) may be doped more than a silicon layer. In an example, the doping concentration of the third doped region (not shown) may be about $10^{14}$ $cm^{-3}$ to about $10^{21}$ $cm^{-3}$. An avalanche effect may occur on a part adjacent to a surface on which the first doped region 116 is in contact with the third doped region (not shown).

Thus, it is possible to obtain a photodetector compatible with a CMOS process and having enhanced photodetection performance.

Referring back to FIG. 21, the optical waveguide 190 may be disposed on the substrate 104 including the buried oxide layer 200. The optical waveguide 190 may be formed by a CVD process. The CVD process may include an RPCVD or UHCVD process. In an example, the optical waveguide 190 may be formed by epitaxial growth.

The first doped region 116 may be disposed in an upper portion of the optical waveguide 190. The first doped region 116 may be formed by ion implantation.

The second doped regions 122 may be disposed in an upper portion of the substrate 104. The second doped region 122 may be formed by ion implantation.

The optical absorption pattern 140 and the contact pattern 150 may be disposed on substrate 104. The optical absorption pattern 140 and the contact pattern 150 may be formed by a CVD process. In an example, the optical absorption pattern 140 and the contact pattern 150 may be formed by the patterning of an optical absorption layer (not shown) and a contact layer (not shown). The optical absorption layer (not shown) may be formed by germanium epitaxial growth. The contact layer (not shown) may be formed by doped silicon epitaxial or poly silicon growth. In another example, the optical absorption pattern 140 and the contact pattern 150 may be formed by SEG.

The protective layer 160 may be disposed to cover all of the substrate 104, the contact pattern 150, and the optical absorption pattern 140. The protective layer may be formed by the CVD process. The protective layer 160 may be etched so that the upper portions of the contact region 122 and the contact pattern 150 may be exposed.

The electrodes 172 may be disposed on the contact region 122 and the contact pattern 150 that have been exposed. The electrodes 172 may include silicide films (not shown). Contact resistances between the electrodes 172 and the contact region 122 and between the electrode 172 and the contact pattern 150 may decrease.

According to an embodiment of the inventive concept, it is possible to provide a photodetector compatible with a CMOS process.

A person skilled in the art may understand that the inventive concept may be practiced in other particular forms without changing the technical spirit or essential characteristic of the inventive concept. Therefore, embodiments and experimental examples described above should be understood as illustrative and not limitative in every aspect. The scope of the inventive concept is represented by the following claims rather than the detailed description and it should be construed that all changes and variations derived from the meaning and scope of the following claims and the equivalents thereof are included in the scope of the inventive concept.

What is claimed is:
1. A photodetector comprising:
a substrate;
a first doped region in an upper portion of the substrate;
a second doped region having a ring structure, wherein the second doped region is provided in the substrate, surrounds the first doped region, and is horizontally spaced apart from the first doped region;
an optical absorption layer on the first doped region, the optical absorption layer absorbing photons to generate an electrical signal;
a contact layer on the optical absorption layer;
a first electrode on the contact layer; and
a second electrode on the second doped region,
wherein the first doped region has a first conductive type and directly contacts the optical absorption layer, and the second doped region has a second conductive type,
wherein top surfaces of the first and second doped regions and the substrate are coplanar with each other, and
wherein a magnitude of the electrical signal is amplified under the first doped region.

2. The photodetector of claim 1, further comprising a third doped region having a ring structure, wherein the third doped region is provided in the substrate, surrounds the first doped region, and is disposed between the first doped region and the second doped region, and
wherein the substrate is an intrinsic silicon substrate, and the third doped region has the first conductive type.

3. The photodetector of claim 2, wherein the first conductive type is a p type and the second conductive type is an n type.

4. The photodetector of claim 1, further comprising:
a third doped region having a ring structure and disposed in the substrate; and
a fourth doped region disposed under the first doped region and in the substrate; and
wherein the third doped region surrounds the first doped region and the fourth doped region, and
wherein the third doped region has the first conductive type, the substrate is a second conductive type silicon substrate, the fourth doped region has the second conductive type, and the doping concentration of the fourth doped region is higher than that of the substrate.

5. The photodetector of claim 4, wherein the first conductive type is a p type and the second conductive type is an n type.

6. The photodetector of claim 1, wherein the first doped region has a plurality of rings when viewed from a top.

7. The photodetector of claim 6, wherein depths of lower surfaces of the plurality of rings are different from one another.

8. The photodetector of claim 6, wherein the plurality of rings has different doping concentrations.

9. The photodetector of claim 1, wherein the optical absorption layer comprises any one selected from among germanium (Ge), gallium arsenic (GaAs), indium phosphide (InP), and indium gallium arsenic (InGaAs).

10. The photodetector of claim 1, further comprising an etched guard ring having a ring structure, wherein the etched guard ring protrudes from the substrate and surrounds the first doped region, and
wherein the substrate and the etched guard ring include intrinsic silicon.

11. A photodetector comprising:
a substrate;
an optical waveguide protruding from the substrate and extending in a first direction;
a first doped region in an upper portion of the optical waveguide;
second doped regions being spaced apart from the optical waveguide in a second direction intersecting the first direction;
an optical absorption layer on the first doped region, the optical absorption layer absorbing photons to generate an electrical signal; and
a contact layer on the optical absorption layer,
wherein the substrate comprises a buried oxide layer,
wherein a magnitude of the electrical signal is amplified under the first doped region, and
wherein the first doped region has a first conductive type and directly contacts the optical absorption layer, and the second doped regions have a second conductive type.

12. The photodetector of claim 11, wherein the substrate and the optical waveguide include intrinsic silicon.

13. The photodetector of claim 11, further comprising a third doped region provided in the substrate and under the first doped region,
wherein the third doped region has the second conductive type, and the substrate and the optical waveguide include second conductive type silicon.

14. The photodetector of claim 13, wherein the first conductive type is a p type and the second conductive type is an n type.

15. The photodetector of claim 4, wherein the third doped region directly contacts the first and fourth doped regions.

16. The photodetector of claim 4, wherein the doping concentration of the fourth doped region is in a range from $10^{14}$ cm$^{-3}$ to $10^{21}$ cm$^{-3}$.

17. The photodetector of claim 16, wherein the doping concentration of the fourth doped region is in a range from $10^{16}$ cm$^{-3}$ to $10^{21}$ cm$^{-3}$.

18. The photodetector of claim 11, wherein a top surface of the first doped region is substantially coplanar with a top surface of the optical waveguide.

19. The photodetector of claim 1, wherein the optical absorption layer and the contact layer have a vertically uniform sidewall.

20. The photodetector of claim 11, wherein the optical absorption layer and the contact layer have a vertically uniform sidewall.

* * * * *